(12) United States Patent
Chen

(10) Patent No.: US 6,239,040 B1
(45) Date of Patent: May 29, 2001

(54) METHOD OF COATING AMORPHOUS SILICON FILM

(75) Inventor: Shih-Ching Chen, Nantou Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/183,061

(22) Filed: Oct. 30, 1998

(30) Foreign Application Priority Data

Jun. 23, 1998 (TW) .................................................. 87110061

(51) Int. Cl.[7] ........................... H01L 21/033; C23C 16/30
(52) U.S. Cl. ........................... 438/761; 438/764; 438/778; 438/787; 438/791; 438/694; 427/255.7; 427/255.29; 427/255.37; 427/255.394; 427/282
(58) Field of Search ........................... 427/79, 81, 255.27, 427/255.37, 255.393, 255.7, 255.29, 255.394, 99, 282; 438/229, 299, 239, 253, 761, 764, 778, 787, 791, 694

(56) References Cited

U.S. PATENT DOCUMENTS

| | | | |
|---|---|---|---|
| 5,538,592 | * 7/1996 | Chen et al. | 438/396 |
| 5,837,582 | * 11/1998 | Su | 438/255 |
| 5,843,821 | * 12/1998 | Tseng | 438/253 |
| 5,893,730 | * 4/1999 | Yamazaki et al. | 438/166 |
| 5,897,352 | * 4/1999 | Lin et al. | 438/255 |

* cited by examiner

*Primary Examiner*—Timothy Meeks
*Assistant Examiner*—Bret Chen
(74) *Attorney, Agent, or Firm*—Thomas, Kayden, Horstemeyer & Risley

(57) ABSTRACT

A method of coating an amorphous silicon layer. An amorphous silicon layer is directly deposited on the polysilicon nodes by a self-aligned method. A chemical mechanical polishing process is performed to control the thickness of the amorphous silicon layer. No additional photoresist is used during the whole processes. Therefore, the duration for deposition can be reduced and the quality of the amorphous silicon film is improved.

20 Claims, 7 Drawing Sheets

METHOD OF COATING AMORPHOUS SILICON FILM

CROSS-REFERENCE TO RELATED APPLICATION

This application claims the priority benefit of Taiwan application serial no. 87110061, filed Jun. 23, 1998, the full disclosure of which is incorporated herein by reference.

BACKGROUND OF THE INVENTION

1. Field of Invention

The present invention relates to a method of coating an amorphous silicon film. More particularly, the present invention relates to a method of coating an amorphous silicon film by a self-aligned process.

2. Description of Related Art

With the steady increase in integrated circuit (IC) density and requirements for low energy consumption in an IC, semiconductor industry is forced to move towards a new art that can manufacture a submicron device. Therefore, a dynamic random access memory (DRAM) with versatile functions causes a great interest. While manufacturing a DRAM, sufficient surface areas are required for the electrodes of storage capacitor to maintain or increase the appropriate electric charge storage. It is particularly a big challenge for DRAM fabrication to store sufficient electric charges on the electrodes for higher integration. The required capacitance can be achieved by close packed storage cells. But with the reducing dimensions of DRAM cells and the close packed capacitors thereof, it is more difficult to store sufficient charges on the capacitors.

The capacitor is the heart of DRAM cells for signal storage. The more charges the capacitor stores, the more signals can be accessed. Therefore, the noises while using amplifiers to read data are obviously reduced. The basic structure of a capacitor is composed of two parallel conductive plates and a dielectric material between these two plates. The capacitance of a capacitor is determined from the dielectric constant of the dielectric material, the surface area of the conductive plates and the thickness of dielectric material. Therefore, the surface area of the conductive plates is increased in order to increase the capacitance. One of the methods for increasing the surface areas of the conductive plates is to form hemispherical grains (HSG) on the conductive plates. The conventional method of forming storage node electrodes using hemispherical grains can increase the capacitance, by which the height and the surface dimension of the electrodes are not required to be increased.

There are several methods of forming hemispherical grains at present. For example, hemispherical grains are directly deposited on a wafer, or a material layer is first deposited on a wafer, the material layer is then annealed to form hemispherical grains. No matter which the manufacturing method is used, amorphous silicon is used as the material forming the hemispherical grains.

Amorphous silicon is commonly applied for thin film transistors and other switch devices. The manufacturing art about the amorphous silicon film in later years is moved towards the purposes of lowering manufacturing capital and increasing qualities of the amorphous silicon film. An amorphous silicon film is formed by plasma-enhanced chemical vapor deposition (PECVD). The PECVD is performed to discharge continuously with high frequency or with radio wave frequency, by which silane ($SiH_4$) is decomposited to form a hydrogenation amorphous silicon film.

FIGS. 1A to 1B are flow charts showing a conventional method of coating an amorphous silicon film. Referring to FIG. 1A, a semiconductor substrate 100 is provided. An insulating layer 102 is deposited on the substrate 100. Openings 10 are formed in the insulating layer 102. An amorphous silicon layer 12 is deposited to cover the insulating layer 102 and the openings 10. Referring next to FIG. 1B, bottom-electrodes 110 are defined by a photolithography and an etching processes. The feature of the method is to use amorphous silicon as the material of forming the bottom-electrodes. The disadvantage of the method is that an amorphous silicon film applied to nodes with a specific height is restricted because of the very slow deposition rate of an amorphous silicon film. If an amorphous silicon film with larger thickness is deposited to obtain more surface areas, it needs to take three times depositing time of an amorphous silicon layer than a doped polysilicon layer with the same thickness.

FIGS. 2A to 2E are flow charts showing another conventional method of covering an amorphous silicon film. Referring to FIG. 2A, a semiconductor substrate 200 is provided. An insulating layer 202 is deposited on the substrate 200. Openings 20 are formed in the insulating layer 202. A doped polysilicon layer 22 is deposited to cover the insulating layer 202 and the openings 20. Referring to FIG. 2B, an amorphous silicon layer 24 is formed on the doped polysilicon layer 22. Referring to FIG. 2C, the polysilicon layer 22 and the amorphous silicon layer 24 are defined to form the polysilicon layer 26 and the amorphous polysilicon layer 28 by a photolithography process and an etching process. Referring to FIG. 2D, an amorphous silicon layer 30 is formed, conformally covering the polysilicon layer 26 and the amorphous silicon layer 28. Referring to FIG. 2E, spacers 32 are formed from the amorphous silicon layer 30 on sidewalls of the polysilicon layer 26 to remove a portion of the amorphous silicon layer 30, for example, by dry etching. A bottom-electrode 208 is composed of the polysilicon layer 26, the spacers 32 and the amorphous silicon layer 38 formed after etching. In this method, the feature is that the amorphous silicon film is deposited to form the spacers conformally to the polysilicon blocks. Using the method, it takes less time forming the bottom-electrode. The disadvantage of the method is that the amorphous silicon layer at the corner of the bottom-electrode is thinner, so it causes the bad electricity of the bottom-electrode after etching the amorphous silicon layer.

SUMMARY OF THE INVENTION

Accordingly, the present invention is to provide a method of coating an amorphous silicon film. An amorphous silicon layer is directly deposited by a self-aligned method, therefore, the thickness of the formed film can be controlled accurately. No additional photoresist is used during the whole processes, thereby the duration of performing the process is reduced and a better quality of an amorphous silicon film is obtained. Besides, polysilicon nodes are formed from doped polysilicon to reduce the duration for deposition.

To achieve these and other advantages and in accordance with the purpose of the invention, as embodied and broadly described herein, the invention provides a method of coating an amorphous silicon film. A semiconductor substrate is provided. A plurality of polysilicon blocks is formed on the substrate. A thin silicon nitride layer is formed to conformally cover the polysilicon blocks. A silicon dioxide layer is formed on the silicon nitride layer to fill vacant spaces between the polysilicon blocks. A polishing process is performed to remove a portion of the silicon dioxide layer to expose the silicon nitride layer. The silicon nitride layer without being covered with the silicon dioxide layer is removed to expose the substrate. An amorphous silicon layer is formed to cover the substrate. A polishing step is performed to remove a portion of the amorphous silicon layer to expose the silicon dioxide layer. The residual silicon dioxide layer and the residual silicon nitride layer is respectively removed, wherein the polysilicon blocks are covered with the amorphous silicon layer. A bottom-electrode is formed from the polysilicon blocks and the amorphous silicon layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 3A through FIG. 3I are cross-sectional views showing a method of covering an amorphous silicon layer according to the preferred embodiment of this invention.

DESCRIPTION OF THE PREFERRED EMBODIMENTS

Figure 1A:
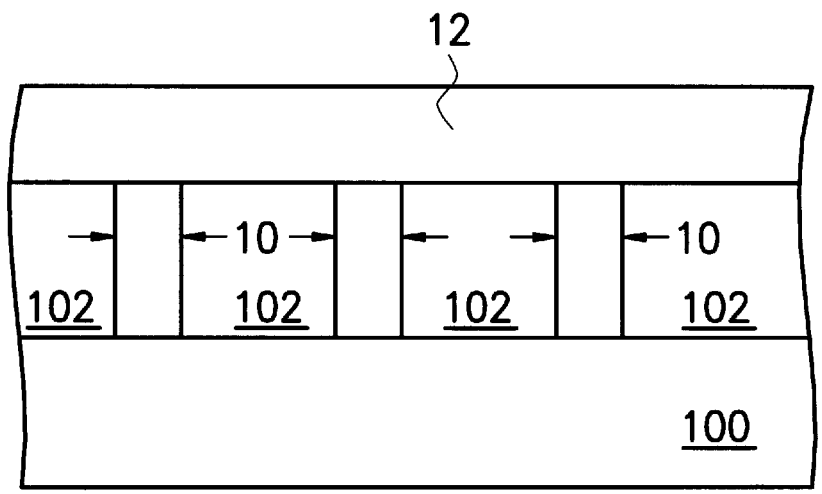
FIG. 1A through FIG. 1B are cross-sectional views showing the first conventional method of covering an amorphous silicon layer.
Figure 1B:
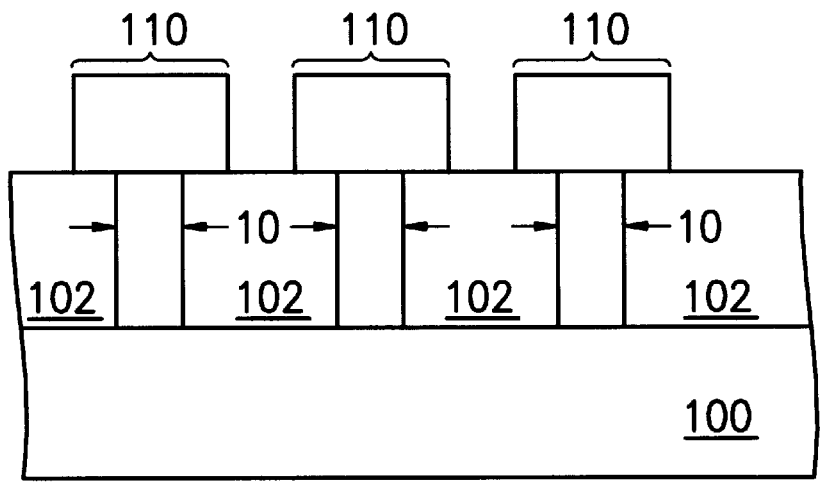
Figure 2A:
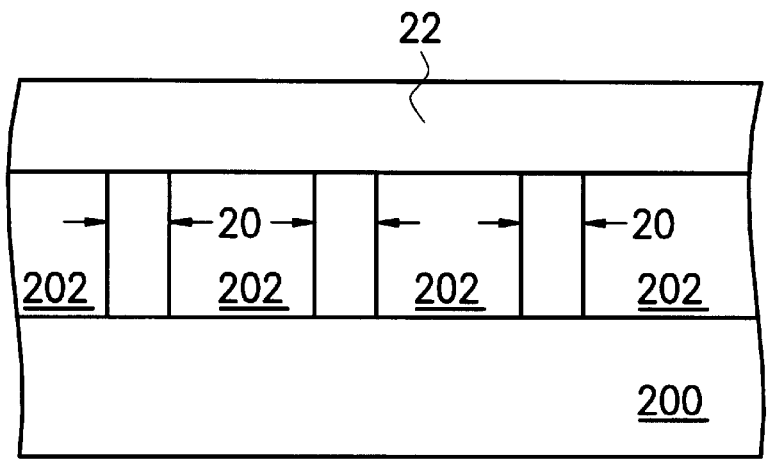
FIG. 2A through FIG. 2E are cross-sectional views showing the second conventional method of covering an amorphous silicon layer.
Figure 2B:
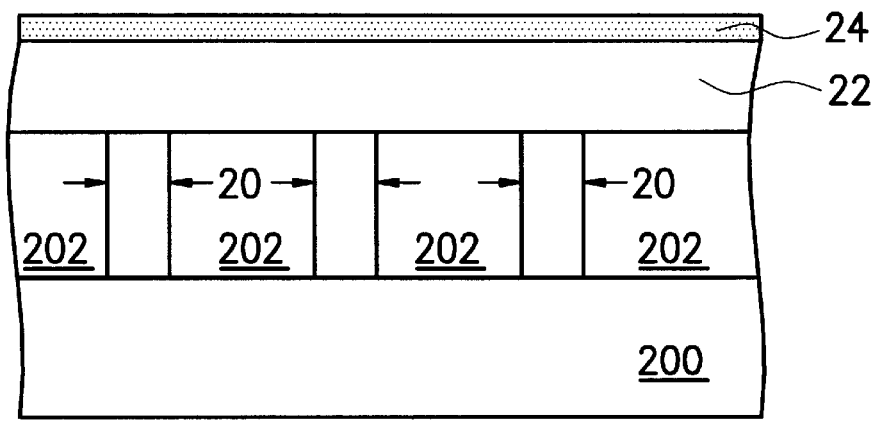
Figure 2C:
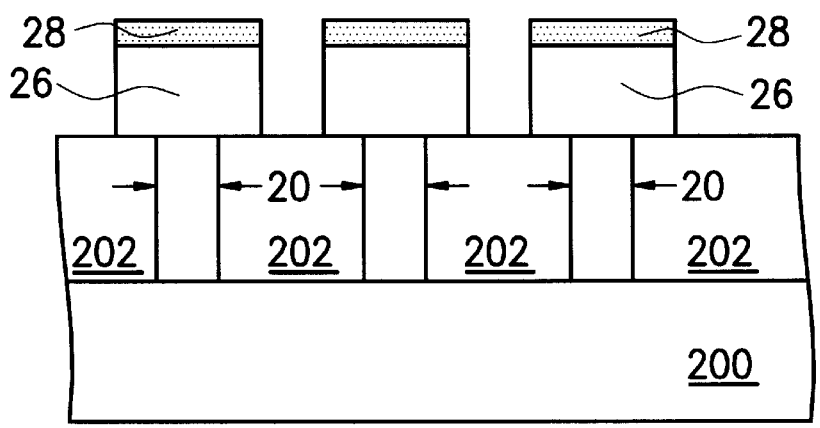
Figure 2D:
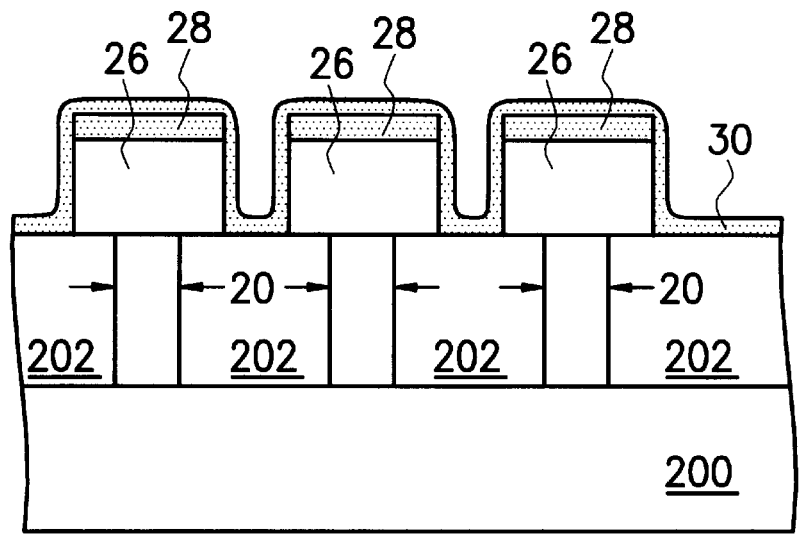
Figure 2E:
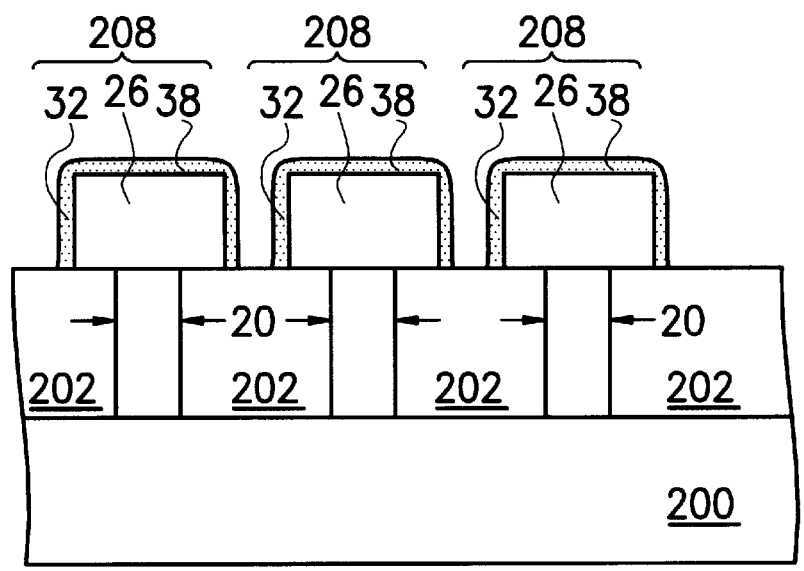

Reference will now be made in detail to the present preferred embodiments of the invention, examples of which are illustrated in the accompanying drawings. Wherever possible, the same reference numbers are used in the drawings and the description to refer to the same or like parts.

FIG. 3A through FIG. 3I are cross-sectional views showing a method of covering an amorphous silicon layer according to the preferred embodiment of this invention.

Figure 3A:
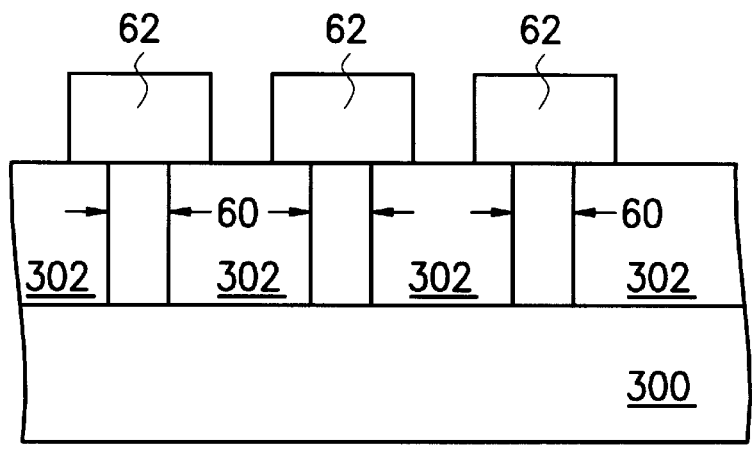

Referring to FIG. 3A, an insulating layer 302 is formed on a substrate 300. Openings 60 are formed in the insulating layer 302. A doped polysilicon layer is formed over the substrate 300 and fills the openings 60, for example, by low pressure chemical vapor deposition (LPCVD). The operating temperature is ranged from about 500° C. to about 620° C. The operating pressure is ranged from about 0.2 torr to about 0.6 torr. The doped polysilicon layer is patterned as doped polysilicon blocks 62 by a photolithography and an etching processes. There is vacant space between the two neighboring polysilicon blocks 62. Typically, the polysilicon blocks 62 are connected with the polysilicon within the openings 60. Thus, these conductive layers can be electrically coupled to the substrate 300.

Figure 3B:
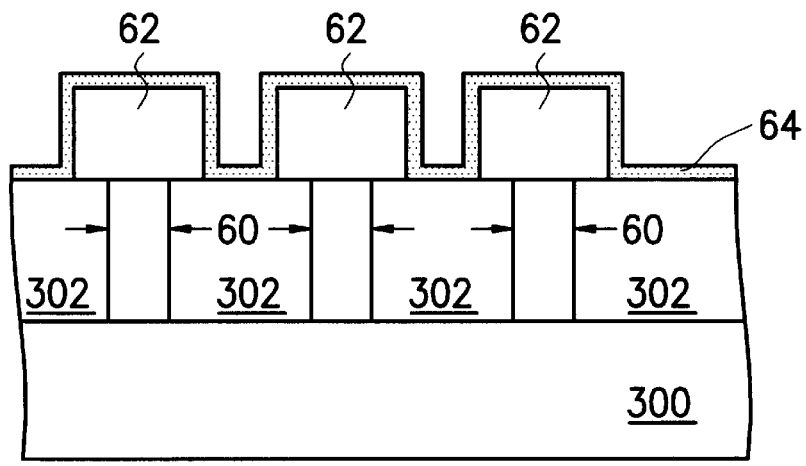

Referring to FIG. 3B, a silicon nitride layer 64 is formed over the substrate 300 by CVD, such as plasma-enhanced (PECVD). The silicon nitride layer 64 is conformal to the insulating layer 302 and the polysilicon blocks 62. The thickness of the silicon nitride layer 64 determines thickness a bottom-electrode of a capacitor formed subsequently. In other words, the required thickness of the amorphous silicon layer of the bottom-electrode is controlled by the thickness of the silicon nitride layer. A gas, such as silane ($SiH_4$), ammonia and nitrogen, is introduced as the reactive gas. The operating temperature is ranged from about 250° C. to about 400° C. The operating pressure is ranged from about 1 to about 5 torr.

Figure 3C:
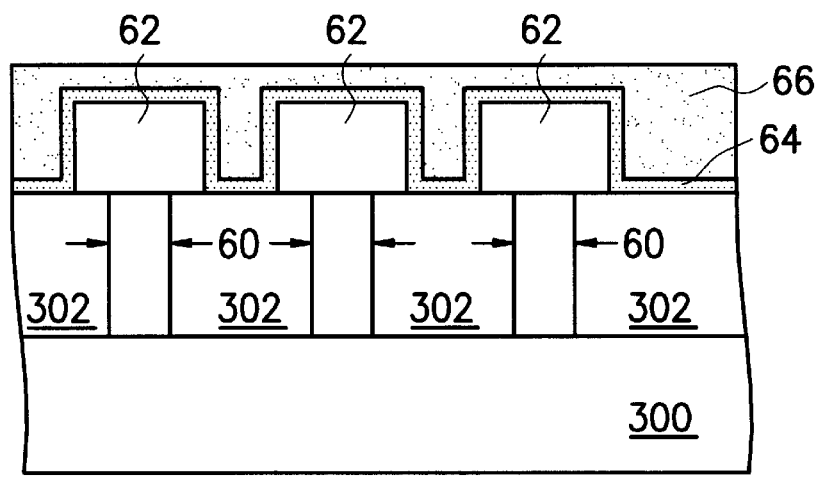

Referring to FIG. 3C, a silicon dioxide layer 66 is formed on the silicon nitride layer to fill the vacant space between the polysilicon blocks 62 by CVD, such as PECVD. A gas, such as silane ($SiH_4$) and $N_2O$, is introduced as the reactive gas. The operating temperature is ranged from about 300° C. to about 400° C. The operating pressure is ranged from about 0.1 to about 5 torr.

Figure 3D:
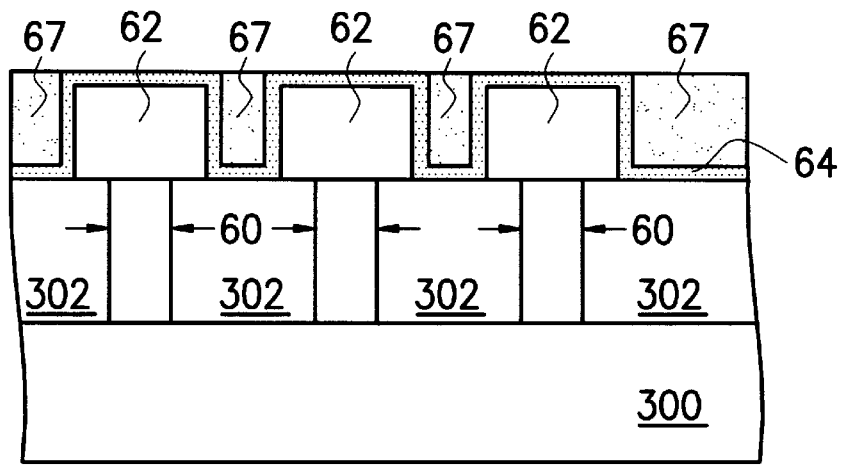

Referring to FIG. 3D, a chemical mechanical polishing (CMP) process is performed to remove a portion of the silicon dioxide layer 66 until the silicon nitride layer 64 is exposed. Then, the residual silicon dioxide layer 67 left between the two polysilicon blocks 62 is denoted as the silicon dioxide layer 67.

Figure 3E:
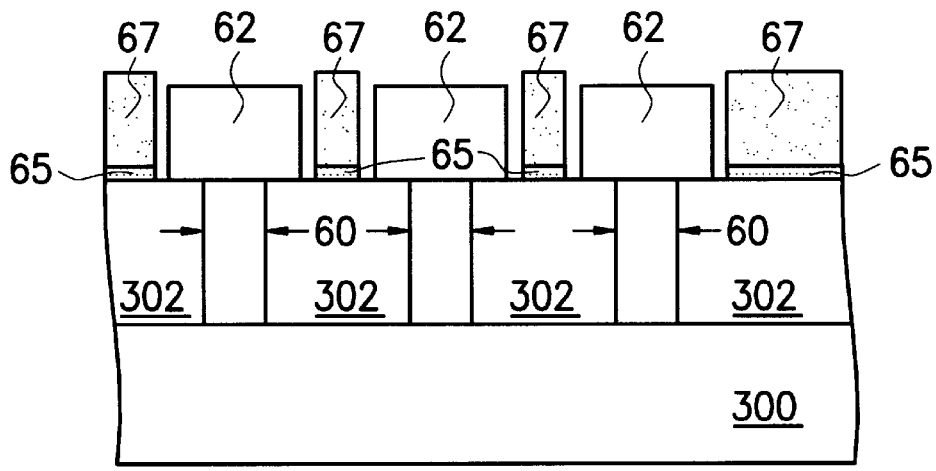

Referring to FIG. 3E, the silicon nitride layer 64 is etched by a dry etching process using fluoride plasma, such as nitrogen fluoride plasma. Because it has higher selectivity to etch the silicon nitride layer than to etch the silicon oxide layer for the nitrogen fluoride plasma, the silicon nitride layer 65 below the silicon dioxide layer 67 is protected while performing an etching process. In addition, the anisotropic of the dry etching process with the nitrogen fluoride plasma is advantageous to the silicon nitride layer 65, the silicon nitride layer 65 is not damaged and is left while performing the dry etching process. Therefore, only the silicon nitride layer without being protected by the silicon dioxide layer 67 is removed by the dry etching process.

Figure 3F:
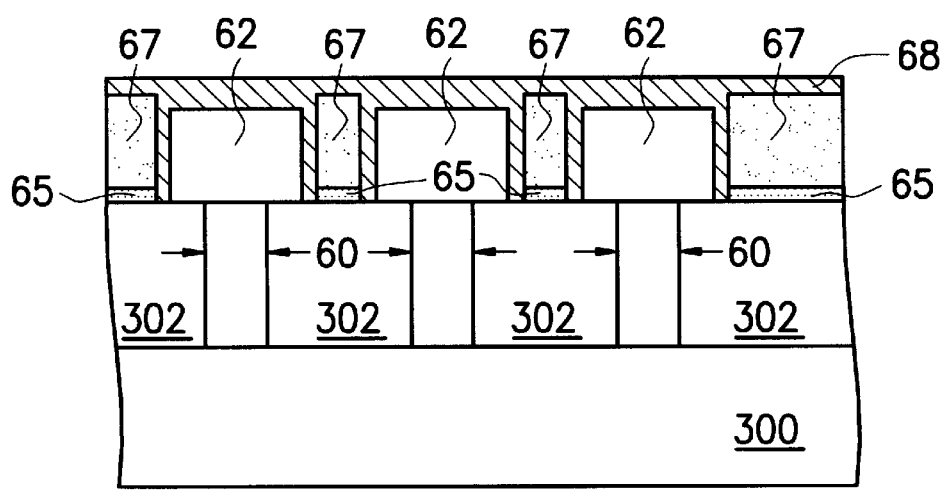

Referring to FIG. 3F, an amorphous silicon layer 68 is formed by CVD, such as LPCVD, to cover the silicon dioxide layer 67 and fill the vacant space between the doped polysilicon blocks 62. The operating temperature is controlled at the transition temperature of the amorphous silicon nitride layer 68 ranged from about 500° C. to 560° C.

Figure 3G:
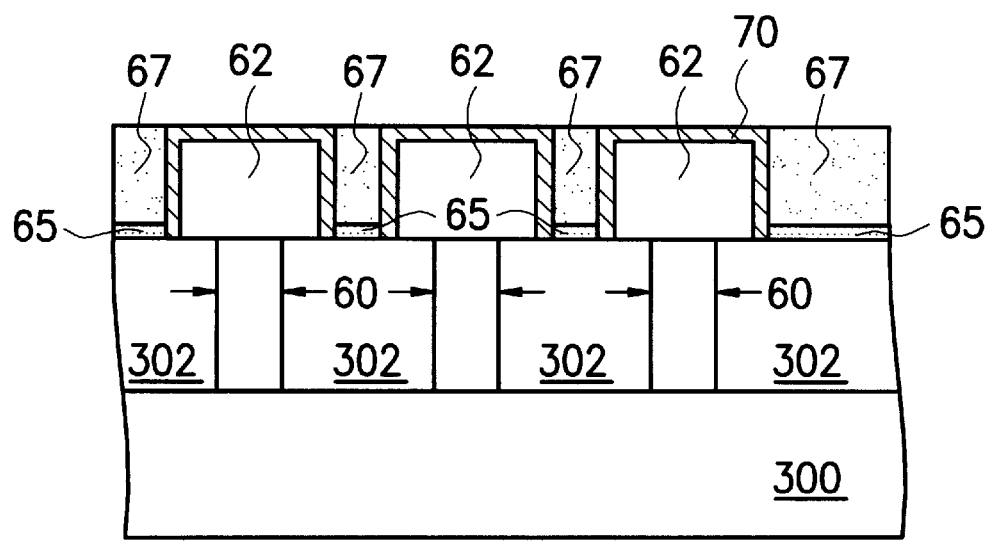

Referring to FIG. 3G, a portion of the amorphous silicon layer 68 is removed, for example, by CMP to expose the silicon dioxide layer 67. At that time, the amorphous silicon layer 68 is formed as the amorphous silicon layer 70 with the required thickness to cover the doped polysilicon blocks.

Figure 3H:
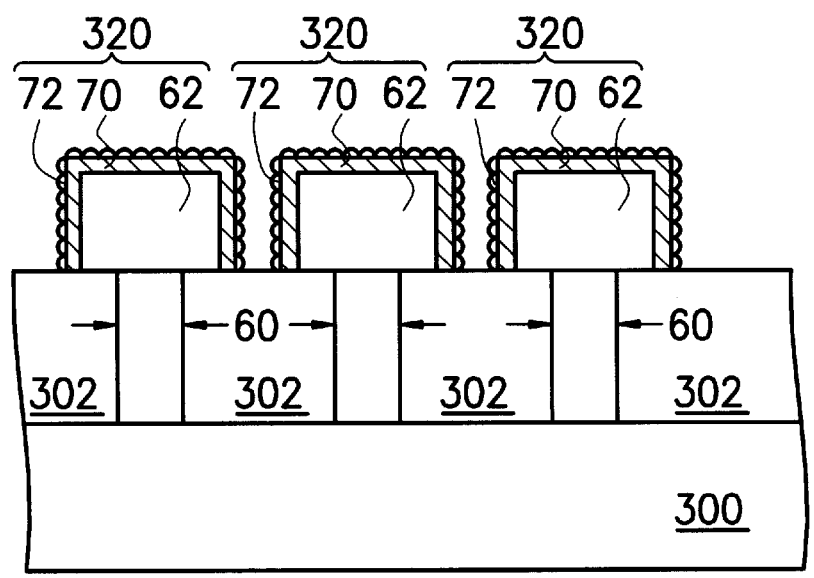
Figure 31:
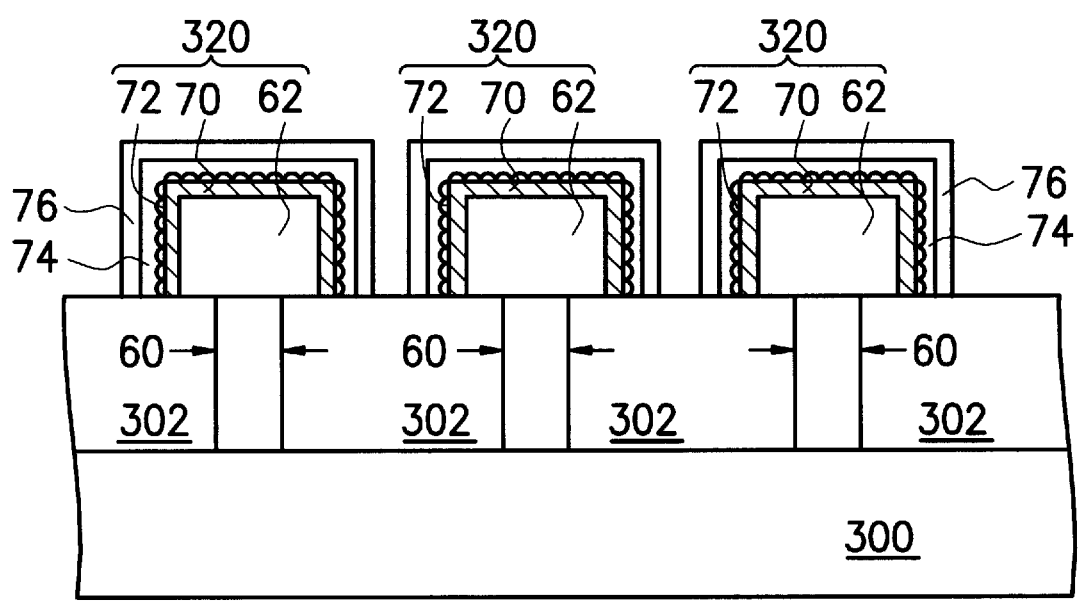

Referring to FIG. 3H, the silicon dioxide layer 67 and the silicon nitride layer 65 are respectively removed, for example, by a dry etching process. The process of etching the silicon dioxide layer 67 is performed by carbon fluoride plasma, such as $CF_4$ adding appropriate hydrogen to increase the selectivity for silicon dioxide. The process of etching the silicon nitride layer 65 is performed, for example, by nitrogen fluoride plasma. Typically, a hemispherical grained layer 72 is formed on the amorphous silicon layer 70 to increase the surface area of the bottom-electrode 320, so as to increase the charge storing capacitance. A bottom-electrode 320 is composed of the doped polysilicon blocks 62, the amorphous silicon layer 70 conformally covered the doped polysilicon blocks and the hemispherical grained layer 72.

Referring to FIG. 3I, a dielectric layer 74 is formed to cover the bottom-electrode 320. A top-electrode 76 is formed over the dielectric layer 74. Up to the stage, a complete capacitor, being composed of the bottom-electrode 320, the dielectric layer 74 and the top-electrode 76, is formed.

According to the preferred embodiment of the invention, the advantages of the invention comprise:

1. An amorphous silicon layer is formed by a self-aligned process. The thickness of the silicon nitride layer is controlled to determine the thickness of the amorphous silicon layer covering the polysilicon nodes. Therefore, the amorphous silicon film with an uniform thickness can be formed. The bad electric properties caused by a thinner amorphous silicon layer formed at the corner of the bottom-electrode in the conventional method is improved.

2. In the invention, a silicon nitride layer with required thickness is introduced to accurately determine the thickness of the amorphous silicon layer of the bottom-electrode. The thickness of the silicon nitride layer can be controlled as required by performing a CMP process for planarization of the silicon dioxide layer.

3. In the conventional method, the bottom-electrode is formed by depositing an amorphous silicon layer. However, it needs to take three times depositing time of an amorphous silicon layer than a doped polysilicon layer with the same thickness. In the invention, the bottom-electrode is formed by depositing the polysilicon layer. Therefore, it takes less time to form the bottom-electrode by depositing doped polysilicon than that by completely depositing amorphous silicon.

4. No additional photoresist is used during the process of forming an amorphous silicon film. Because the deposited amorphous silicon layer is not polluted by the residual grains generated from the step of forming the photoresist, the quality of the amorphous silicon film is ensured.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of coating an amorphous silicon film formed on polysilicon blocks, comprising:

providing a substrate;

forming an insulating layer over the substrate;

forming a plurality of polysilicon blocks through the insulating layer to make contact with the substrate;

forming a silicon nitride layer over the insulating layer to conformally cover the polysilicon blocks;

forming a silicon dioxide layer on the silicon nitride layer to fill vacant spaces between the polysilicon blocks;

polishing the silicon dioxide layer until the silicon nitride layer is exposed to remove the silicon dioxide layer above the silicon nitride layer;

removing a portion of the silicon nitride layer with the silicon dioxide layer as a mask to expose the polysilicon blocks;

forming an amorphous silicon layer over the silicon dioxide layer and the polysilicon blocks;

polishing the amorphous silicon layer until the silicon dioxide layer is exposed to leave a remaining amorphous silicon layer covering the polysilicon blocks; and removing the silicon dioxide layer and a underlying silicon nitride layer.

2. A method according to claim 1, wherein the step of forming the polysilicon layer is by chemical vapor deposition.

3. A method according to claim 1, wherein the step of forming the silicon nitride layer is by chemical vapor deposition.

4. A method according to claim 1, wherein the step of forming the silicon dioxide layer is by chemical vapor deposition.

5. A method according to claim 1, wherein the step of polishing is by a chemical mechanical polishing process.

6. A method according to claim 1, wherein the step of removing the silicon nitride layer with the silicon dioxide layer as a mask is by a dry etching process.

7. A method according to claim 1, wherein the step of forming the amorphous silicon layer is by chemical vapor deposition.

8. A method according to claim 1, wherein the step of polishing the amorphous silicon layer is by a dry etching process.

9. A method according to claim 1, wherein the step of removing the underlying silicon nitride layer is by a dry etching process.

10. A method according to claim 1, further comprising forming hemispherical grains on the remaining amorphous silicon layer.

11. A method of manufacturing a capacitor on a substrate, comprising:

forming an insulating layer over a substrate;

forming a plurality of polysilicon blocks through the insulating layer to make contact with the substrate;

forming a silicon nitride layer to conformally cover the polysilicon blocks;

forming a silicon dioxide layer on the silicon nitride layer to fill vacant spaces between the polysilicon blocks;

removing a portion of the silicon dioxide layer above the silicon nitride layer to expose the silicon nitride layer;

removing the silicon nitride layer exposed by the silicon dioxide layer;

forming an amorphous silicon layer over the silicon dioxide layer and the polysilicon blocks;

removing a portion of the amorphous silicon layer until the silicon dioxide layer is exposed to leave a remaining amorphous silicon layer remains covering the polysilicon blocks;

removing the silicon dioxide layer and a remaining silicon nitride layer;

forming a hemispherical grained layer on the amorphous silicon layer, thereby a bottom-electrode is formed from the hemispherical grained layer, the polysilicon blocks and the amorphous silicon layer;

forming a dielectric layer on the bottom-electrode; and forming a top-electrode on the dielectric layer.

12. A method according to claim 11, wherein the step of forming the polysilicon layer is by chemical vapor deposition.

13. A method according to claim 11, wherein the step of forming the silicon nitride layer is by chemical vapor deposition.

14. A method according to claim 11, wherein the step of forming the silicon dioxide layer is by chemical vapor deposition.

15. A method according to claim 11, wherein the step of removing a portion of the silicon dioxide layer is by a chemical mechanical polishing process.

16. A method according to claim 11, wherein the step of removing the silicon nitride layer with the silicon dioxide layer as a mask is by a dry etching process.

17. A method according to claim 11, wherein the step of forming the amorphous silicon layer is by chemical vapor deposition.

18. A method according to claim 11, wherein the step of removing the amorphous silicon layer is by a chemical mechanical polishing process.

19. A method according to claim 11, wherein the step of removing the silicon dioxide layer is by a dry etching process.

20. A method according to claim 11, wherein the step of removing the underlying silicon nitride layer is by a dry etching process.

* * * * *